United States Patent
Abraham et al.

(10) Patent No.: US 6,538,919 B1
(45) Date of Patent: Mar. 25, 2003

(54) MAGNETIC TUNNEL JUNCTIONS USING FERRIMAGNETIC MATERIALS

(75) Inventors: David W. Abraham, Croton-on-Hudson, NY (US); Stuart S. P. Parkin, San Jose, CA (US); John C. Slonczewski, Katonah, NY (US); Philip L. Trouilloud, Norwood, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/708,207

(22) Filed: Nov. 8, 2000

(51) Int. Cl.⁷ .............................................. G11C 11/14
(52) U.S. Cl. ...................... 365/171; 365/158; 365/173; 360/324.11
(58) Field of Search ................. 365/171, 173, 365/158, 55, 66; 360/324.11

(56) References Cited

U.S. PATENT DOCUMENTS

| | | | |
|---|---|---|---|
| 5,640,343 A | 6/1997 | Gallagher et al. | 365/171 |
| 5,650,958 A | 7/1997 | Gallagher et al. | 365/171 |
| 5,946,227 A | 8/1999 | Naji | 365/158 |
| 6,114,719 A | 9/2000 | Dill et al. | 257/295 |
| 6,163,477 A | 12/2000 | Tran | 365/173 |
| 6,166,948 A * | 12/2000 | Parkin et al. | 365/171 |
| 6,178,073 B1 * | 1/2001 | Hayashi | 360/324.11 |
| 6,191,972 B1 | 2/2001 | Miura et al. | 365/171 |
| 6,266,218 B1 * | 7/2001 | Carey et al. | 360/324 |
| 6,272,036 B1 * | 8/2001 | You et al. | 365/173 |

OTHER PUBLICATIONS

Application Serial No. 09/708,253, David W. Abraham, Stuart S.P. Parkin, John C. Slonczewski, Philip L. Trouilloud, Filed on Nov. 8, 2000. *Thermally–Assisted Magnetic Random Access Memory (MRAM)*. (YOR9–1998–0126US1).

Williams et al.; Scanning Thermal Profiler: App. Phys. Letter 23, pp. 1587–1589.

Marvin; Magnetic Recording Handbook, Van Nostrand Reinhold, 1988, pp. 540–580.

R. Merservey and P. M. Tedron, Phys. Rep. 283, 173 (1994).

D.J. Monsma and S.S. P. Parkin, Appl. Phys. Lett. 77, 720 (2000).

\* cited by examiner

*Primary Examiner*—Son T. Dinh
(74) *Attorney, Agent, or Firm*—Marian Underweiser

(57) ABSTRACT

The use of ferrimagnetic materials is proposed for use in magnetic devices. Such magnetic devices include magnetic tunnel junctions (MTJ) which have at least two magnetic layers separated by an insulating barrier layer, wherein at least one of the two magnetic layers is ferrimagnetic. Such MTJ's are used in MRAM (magnetic random access memory) structures. Where the magnetic device is a magnetic sensor, it preferably includes a layer that comprises a ferrimagnetic material separated from another magnetic layer by a barrier layer and the magnetizations of the magnetic layer are oriented at an angle to one another.

20 Claims, 2 Drawing Sheets

MAGNETIC TUNNEL JUNCTIONS USING FERRIMAGNETIC MATERIALS

The present application is related to U.S. patent application Ser. No. 09/708,253 filed on Nov. 8, 2000, entitled "Thermally-Assisted Magnetic Random Access Memory (MRAM)," which is incorporated herein by reference.

FIELD OF THE INVENTION

The present invention relates to magnetic tunnel junctions (MTJ), and to the materials used therein. In particular, the present invention provides for the use of ferrimagnetic materials in MRAM (magnetic random access memory) structures and other MTJ structures to significantly improve the operating window in terms of minimum size, coercive field and other related figures of merit.

BACKGROUND OF THE INVENTION

The memory technology of relevance to this disclosure, named MRAM, is a solid state tunnel junction using magnetic electrodes. For background, reference made to U.S. Pat. Nos. 5,650,958 and 5,640,343 issued to William Joseph Gallagher et al on Jul. 22, 1997 and Jun. 17, 1997, respectively. The storage mechanism relies on the relative orientation of the magnetization of the two electrodes, and on the ability to discern this orientation by electrical means.

In operation as a memory device, an MRAM device can be read by measuring the tunneling resistance (to infer the state of the magnetization of a free or storage layer with respect to a fixed or pinned layer) and written by reversing the free layer magnetization using external magnetic fields. If the free layer is imagined as a simple elemental magnet which is free to rotate but with a strong energetic preference for aligning parallel or antiparallel to the x axis, and if the pinned layer is a similar elemental magnet but frozen in the +x direction, then there are only two relative magnetization states possible for the free and pinned layers of the device: Aligned and anti-aligned.

In current designs for magnetic tunnel junctions (MTJ) used for MRAM sensor or magnetic recording head applications, the device consists of at least three layers: two ferromagnetic electrodes separated by a non-conductive tunnel barrier. The magnetic materials currently used are typical polycrystalline alloys of Ni, Fe and Co. The barrier layer is typically aluminum oxide.

Various parameters are of interest in evaluating the performance of these devices. First, the variation in resistance between the two storage states is described by the magnetoresistance MR-the percentage change in resistance between the two states. Historically ferromagnetic materials with a higher saturation magnetization $M_s$ were used to obtain junctions with higher MR values (see, for example, R. Meservey and P. M. Tedrow, Phys. Rep. 238, 173 (1994)). More recently it has been shown that there is only a weak link between the magnitude of the saturation magnetization and MR of MTJs containing electrodes formed from alloys of Co, Fe and Ni (D. J. Monsma and S. S. P. Parkin, Appl. Phys. Lett. 77, 720 (2000)). Second, the coercive field is of interest since fields generated by currents along wires in the chip will need to be able to rotate the magnetization of the storage layer. As the capacity of memory chips increase, the MTJ area will inevitably become smaller. As this happens, the switching field (also termed the coercive field $H_c$) rises roughly inversely with lateral dimension, for the same material and thickness and the same aspect ratio and shape of the device. Using current designs, one quickly reaches a situation where junction size dictated by needs for density causes the coercive fields to become unmanageably large.

In addition to these issues, there are other problems that arise when trying to push the size of the devices down into the sub-micron regime. First, there are strong demagnetizing fields which will tend to cause the bit to 'erase' over time. Second, the demagnetizing field is non-uniform: In particular it is strongest close to the edges of the devices, and hence control over the uniformity of the device is most important at the very spot where there is the most difficulty in fabrication. Hence, small defects at the edge of the magnetic element can lead to nucleation or pinning sites for unwanted micromagnetic structures, resulting in unpredictability of the junction properties. Third, using polycrystalline material such as permalloy can lead to increased variation in device properties because of random orientation of the microcrystallites. In very small devices, the statistical fluctuations due to the grain structure will become much more pronounced. These grains also can cause variations in the tunneling properties between electrodes in the MTJ, causing further uncertainty or variation in device properties.

Several directions have been proposed in order to alleviate this rising coercivity problem. First, one may reduce the saturation magnetization of the storage electrode, since $H_c$ scales with $M_s$. However, many low $M_s$ materials, for example, formed by alloying Co or Fe with non-magnetic elements, give low MR. Second, one may reduce the thickness of the magnetic electrode, since $H_c$ scales with electrode thickness. Current junctions, however, are on the edge of continuity due to their extremely thin electrodes and further reduction is difficult at best. Clearly, there is a need for a new approach to fabricating small devices while still leaving freedom to tune coercive field and providing an appreciable MR.

SUMMARY OF THE INVENTION

Briefly, in order to overcome the foregoing problems while attaining the objectives outlined above, the present invention proposes the use of ferrimagnetic materials in magnetic devices, including magnetic tunnel junctions (MTJ's, which may be used for MRAM) as well as in magnetic sensors such as magnetic heads. Such use of ferrimagnetic materials may be alone or in conjunction with other non-ferrimagnetic materials. Exemplary preferred materials are (Gd,Tb,Dy)—(Fe,Co) alloys.

The present invention therefore broadly provides a magnetic tunnel junction device, comprising: a first layer and a second layer separated by a barrier layer, wherein at least one of the first and second layers comprises a ferrimagnetic material.

In accordance with a preferred embodiment of the invention, one layer of the first and second layers comprises a ferrimagnetic material and the other layer comprises a ferromagnetic material. Desireably, the ferrimagnetic material and the ferromagnetic material each has its magnetization oriented in a plane parallel to said one layer. Alternatively, the ferrimagnetic material and the ferromagnetic material may each have its magnetization oriented in a plane perpendicular to the aforesaid one layer. According to another preferred embodiment, one layer of the first and second layers may further comprise an anti-ferromagnetic material According to a preferred embodiment, the ferrimagnetic material is characterized by a compensation temperature that exceeds an ambient operating temperature for the aforesaid magnetic tunnel junction (MTJ) device.

By way of example, suitable ferrimagnetic material include at least one of Gd, Tb, and Dy with at least one of Fe and Co, and alloys thereof.

The present invention also provides a memory comprising a plurality of magnetic tunnel junction (MTJ) devices disclosed hereinabove. A memory of this kind is disclosed in U.S. Pat. No. 5,640,343, supra.

The invention further provides a magnetic sensor comprising a first layer and a second layer separated by a non-magnetic layer, as described hereinabove, where the ferrimagnetic material is characterized by a magnetization oriented in a first orientation, the other layer of the first and second layers comprising a magnetic material which is characterized by a magnetization that is oriented at an angle (preferably 90 degrees) to the aforesaid first orientation.

Preferably, the ferrimagnetic material of the magnetic sensor comprises at least one of Gd, Th, and Dy with at least one of Fe and Co, and alloys thereof, while one layer of the first and second layers further comprises an antiferromagnetic material.

DETAILED DESCRIPTION

Figure 1:
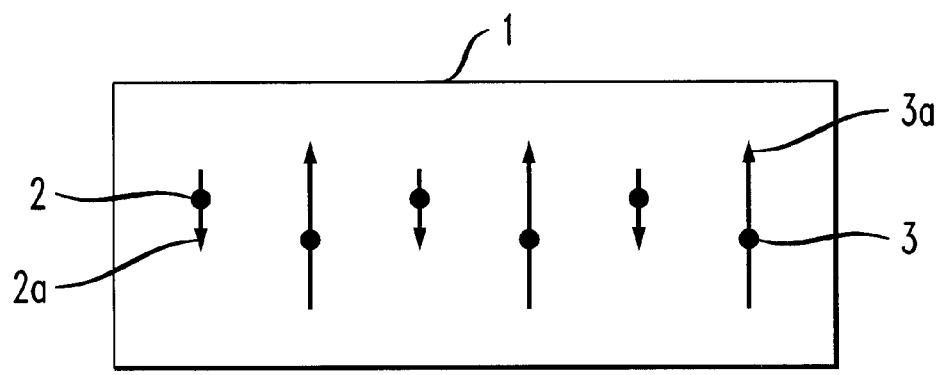
FIG. 1 is a schematic cross-sectional view of a ferrimagnetic magnetic material.

FIG. 1 shows a block 1 of an exemplary ferrimagnetic material comprising iron (Fe) atoms 2 and terbium (Th) atoms 3. It is generally understood that the ferrimagnetic class of materials generally consists of two sublattices, usually a rare earth such as terbium and a transition metal such as iron. At low temperatures (i.e. below compensation temperature), the rare-earth moment 3a (shown by the long arrows in FIG. 1) is larger than that of the transition metal moment 2a (shown by the short arrows in FIG. 1) and thus there is a net magnetization. However, as temperature rises the rare-earth moment decreases more rapidly because it is subject to weaker exchange forces. There is an intermediate temperature (sometimes called compensation temperature or $T_{comp}$) at which the two lattices cancel each other out, and net magnetization of the ferrimagnetic material drops to zero. Both below and above this compensation temperature, there is a finite net magnetization. It is quite possible to tune the compensation temperature by adjusting the composition of the alloy. Moreover, by judicious choice of the component materials used one can also adjust the coercive field of the alloy. Preferably, a fully compensated ferrimagnetic material should be used for the fixed electrode of a random-access memory. As will be understood, the compensation point should be at operating temperature.

Another interesting property of ferrimagnetic materials which is quite important in accordance with the present invention may be illustrated with respect to magneto-optic (MO) storage. At 'rest' (i.e. when the material is at the compensation temperature and not being written) the MO media has no net moment. However, the laser used to interrogate the state of the magnetization only interacts strongly with the transition metal sublattice. Hence, even with no net magnetization, two distinct states can be distinguished optically. However, only when heated can the material be written. The concept of using simultaneous heating and writing is discussed in patent application YOR9-98-0126 entitled "Thermally Assisted MRAM" by David Abraham and Philip Trouilloud.

Figure 2:
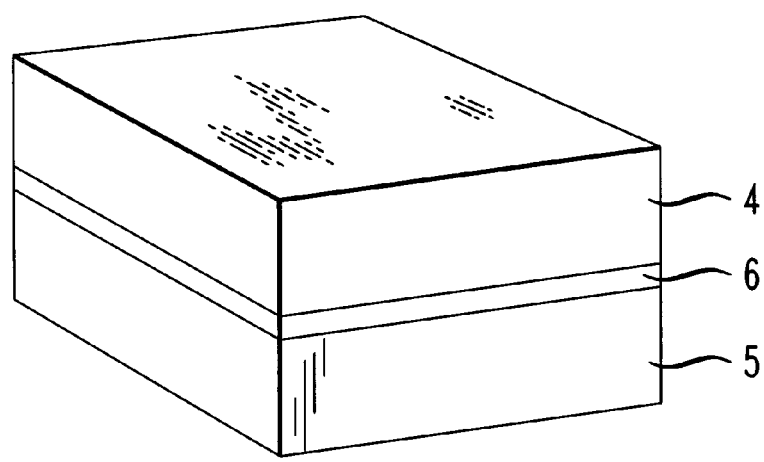
FIG. 2 is a schematic cross-sectional view of a MTJ device in accordance with the present invention.

By use of an appropriately chosen ferrimagnet material for the two MTJ electrodes, the properties of the junction can be optimized. First, and most importantly, the tunneling signal is sensitive to the magnetization state of a preferred one of the sub-lattices even at compensation, in a manner that is analagous to the MO example described hereinabove. In addition, the magnetization can be set by adjusting the compensation temperature relative to operating temperature by choice of the ferrimagnetic's constituent materials. This effectively tunes the coercive field to convenient levels for the intended application. For example, use of a fully compensated, zero moment, ferrimagnet for the fixed electrode eliminates the disturbing effects of stray fields acting on the storage electrode. In addition, by using the compensated material for only the reference or fixed layer, Neel coupling between the reference and storage layers (commonly referred to as "orange-peel" coupling) would be greatly reduced. This is desirable, since this effect is known to cause variations in the magnetic switching properties of the junctions FIG. 2 shows a simplified schematic view of a novel MTJ (magnetic tunnel junction) device which comprises a first layer 4 and a second layer 5 which are separated by a barrier layer 6. According to the invention, one of layers 4, 5 comprises a ferrimagnetic material. In the embodiment of FIG. 2, layer 4 shall be understood to comprise a ferrimagnetic material, such as an alloy of Fe and Tb illustrated in FIG. 1. While the entire layer 4 may be ferrimagnetic, it should be understood that layer 4 may, in fact, be comprised of a plurality of layers, of which only one needs to be ferrimagnetic, in accordance with the invention.

Layer 5 of FIG. 2 is preferably comprised of permalloy or other ferromagnetic material. Barrier layer 6 comprises an electrically insulating material, such as aluminum oxide. During use of the MTJ of FIG. 2, electric current will more easily tunnel through barrier layer 6 when the magnetizations of layer 5 is aligned with the magnetization of the preferred sublattice of layer 4.

According to one embodiment, the magnetizations of layers 4, 5 may each be oriented in a plane that is parallel to the layers 4, 5. Alternatively, the magnetizations of layers 4, 5 may each be oriented in a plan perpendicular to layers 4, 5.

According to another embodiment, (see FIG. 3a) one layer may be magnetized perpendicular and the other may be magnetized parallel to layers 7, 8.

Figure 3A:
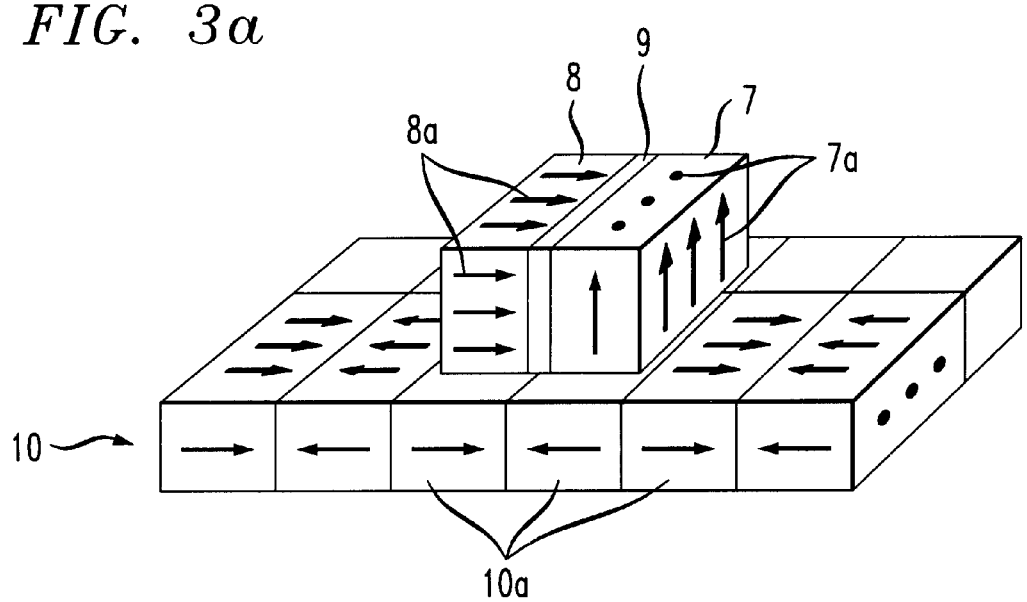
FIG. 3a is a schematic cross-sectional view of one sensor in accordance with the present invention.
Figure 3B:
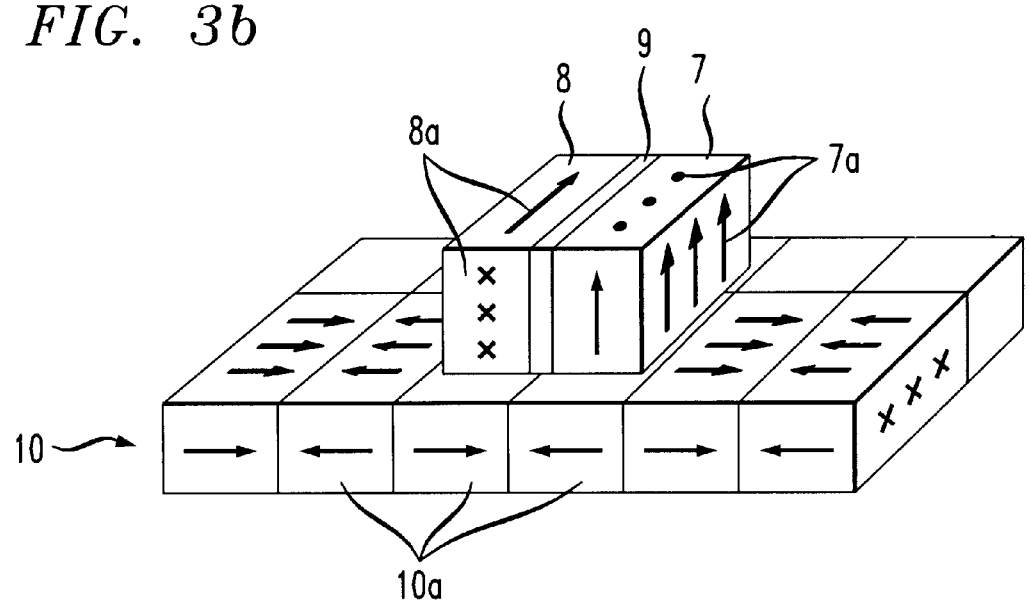
FIG. 3b is a schematic cross-sectional view of another sensor in accordance with the present invention.

FIGS. 3a and 3b illustrate a magnetic sensor comprising a first layer 7 and a second layer 8, which are separated by a barrier layer 9 (e.g. aluminum oxide). In FIGS. 3a, 3b, layer 7 comprises a ferrimagnetic material characterized by a magnetization oriented in an orientation illustrated by arrows 7a. Layer 8 is a magnetic material (e.g. ferromagnetic or ferrimagnetic) which has its magnetization oriented (as illustrated by arrows 8a) at an angle to the first orientation. As shown in FIGS. 3a, 3b, that angle is preferably 90 degrees. As will be understood, for use as a sensor, the magnetic device of FIGS. 3a, 3b must have a non-zero angle between arrows 7a and 8a to permit sensing of bits 10a in magnetization of a nearby medium 10.

While the present invention has been described with reference to preferred embodiments thereof, numerous obvious changes and variations may readily be made by persons skilled in the field of magnetic materials and devices. Accordingly, the invention should be understood to include all such variations to the full extent embraced by the claims.

What is claimed is:

1. A magnetic tunnel junction device, comprising:

a fixed magnetic layer and a free magnetic layer separated by an electrically insulating barrier layer, wherein at least one of the fixed magnetic layer and the free magnetic layer comprises a ferrimagnetic material.

2. The magnetic tunnel junction device according to claim 1, wherein one layer of the fixed magnetic layer and the free magnetic layer comprises a ferrimagnetic material and wherein the other layer comprises a ferromagnetic material.

3. The magnetic tunnel junction device according to claim 2, wherein said ferrimagnetic material and said ferromagnetic material each has a magnetization oriented in a plane parallel to said one layer.

4. The magnetic tunnel junction device according to claim 2, wherein said ferrimagnetic material and said ferromagnetic material each has a magnetization oriented in a plane perpendicular to said one layer.

5. The magnetic tunnel junction device according to claim 2, wherein one of said first layer and said second layer has a magnetization oriented substantially parallel to said one layer and the other layer has a magnetization oriented substantially perpendicular to said other layer.

6. The magnetic tunnel junction device accordingly to claim 1, said ferrimagnetic material being characterized by a compensation temperature that substantially equals an operating temperature for said magnetic tunnel junction device.

7. The magnetic tunnel junction device according to claim 1, wherein said ferrimagnetic material comprises at least one of Gd, Tb, and Dy with at least one of Fe and Co, and alloys thereof.

8. The magnetic tunnel junction device according to claim 2, wherein one layer of the fixed magnetic layer and the free magnetic layer further comprises an anti-ferromagnetic material.

9. A memory comprising a plurality of magnetic tunnel junction (MTJ) devices as set forth in claim 1.

10. The memory according to claim 9, wherein one layer of the fixed magnetic layer and the free magnetic layer comprises a ferrimagnetic material and wherein the other layer comprises a ferromagnetic material.

11. The memory according to claim 10, wherein one layer of the fixed magnetic layer and the free magnetic layer further comprises an anti-ferromagnetic material.

12. The memory according to claim 9, wherein said ferrimagnetic material comprises at least one of Gd, Tb, and Dy with at least one of Fe and Co, and alloys thereof.

13. A magnetic sensor comprising a fixed magnetic layer and a free magnetic layer separated by an electrically insulating barrier layer, wherein at least one of said fixed magnetic layer and said free magnetic layer comprises a ferrimagnetic material.

14. A magnetic sensor as set forth in claim 13, said ferrimagnetic material being characterized by a magnetization oriented in a first orientation, the other layer of said fixed magnetic layer and said free magnetic layer comprising a magnetic material, said magnetic material being characterized by a magnetization oriented at an angle to said first orientation.

15. A magnetic sensor as set forth in claim 14, wherein said angle is 90 degrees.

16. The sensor according to claim 13, wherein one layer of the fixed magnetic layer and the free magnetic layer further comprises an anti-ferromagnetic material.

17. The sensor according to claim 13, wherein said ferrimagnetic material comprises at least onde of Gd, Th, and Dy with at least one of Fe and Co, and alloys thereof.

18. A magnetic tunnel junction device, comprising:

a first layer and a second layer separated by an electrically insulating barrier layer, wherein at least one of the first and second layers is directly adjacent to the barrier layer and comprises a ferrimagnetic material.

19. The magnetic tunnel junction device according to claim 18, further comprising a fixed magnetic layer, wherein the fixed magnetic layer comprises the at least one of the first and second layers comprising the ferrimagnetic material.

20. A magnetic sensor comprising a first layer and a second layer separated by an electrically insulating barrier layer, wherein at least one of said first layer and said second layer is directly adjacent to the barrier layer and comprises a ferrimagnetic material.

* * * * *

UNITED STATES PATENT AND TRADEMARK OFFICE
CERTIFICATE OF CORRECTION

PATENT NO. : 6,538,919 B1 Page 1 of 1
DATED : March 25, 2003
INVENTOR(S) : David W. Abraham et al.

It is certified that error appears in the above-identified patent and that said Letters Patent is hereby corrected as shown below:

<u>Column 3,</u>
Lines 17 and 36, delete "Th" and insert -- Tb --.

<u>Column 6,</u>
Line 27, delete "Th" and insert -- Tb --.

Signed and Sealed this

Twenty-eighth Day of October, 2003

JAMES E. ROGAN
*Director of the United States Patent and Trademark Office*